US012751288B1

(12) United States Patent
Patel et al.

(10) Patent No.: US 12,751,288 B1

(45) Date of Patent: Sep. 29, 2026

(54) THREE-DIMENSIONAL DEVICE PACKAGE WITH CARRIER SUBSTRATE AND THERMAL VIAS

(71) Applicant: Marvell Asia Pte Ltd, Singapore (SG)

(72) Inventors: Janak Patel, South Burlington, VT (US); Richard S Graf, Gray, ME (US); David M. Bond, Apex, NC (US)

(73) Assignee: Marvel Asia Pte Ltd, Singapore (SG)

(*) Notice: Subject to any disclaimer, the term of this patent is extended or adjusted under 35 U.S.C. 154(b) by 701 days.

(21) Appl. No.: 18/321,009

(22) Filed: May 22, 2023

Related U.S. Application Data

(60) Provisional application No. 63/344,665, filed on May 23, 2022.

(51) Int. Cl.

*H10W 40/22* (2026.01)

*H10W 70/60* (2026.01)

(Continued)

(52) U.S. Cl.

CPC ....... *H10W 40/228* (2026.01); *H10W 70/614* (2026.01); *H10W 72/20* (2026.01); *H10W 74/117* (2026.01); *H10W 90/00* (2026.01); *H10W 90/701* (2026.01); *H10W 72/856* (2026.01); *H10W 74/00* (2026.01); *H10W 90/736* (2026.01)

(58) Field of Classification Search

CPC . H10W 40/228; H10W 90/701; H10W 90/00; H10W 72/20; H10W 70/614; H10W 74/117; H10W 72/856; H10W 74/00; H10W 90/736

See application file for complete search history.

(56) References Cited

U.S. PATENT DOCUMENTS

2020/0411473 A1* 12/2020 Chen ........................ H10P 72/74

2021/0242098 A1* 8/2021 Sinha ..................... H10W 40/22

(Continued)

OTHER PUBLICATIONS

Taiwan Semiconductor Manufacturing Company Limited, "TSMC-SoIC," pp. 1-3, years 2010-2023, as downloaded from https://3dfabric.tsmc.com/english/dedicatedFoundry/technology/SoIC.htm.

(Continued)

*Primary Examiner* — Jacob Y Choi

*Assistant Examiner* — Neil R Prasad

(74) *Attorney, Agent, or Firm* — Meitar Patents Ltd.; Daniel Kligler

(57) ABSTRACT

An electronic device includes: (a) a die, including: a first surface having electronic components formed thereon, a second surface opposite the first surface, and first thermal vias (TVs) traversing through the die between the first and second surfaces, the first TVs being: arranged in a first layout, and configured to dissipate heat generated by operation of the electronic components, (b) a carrier substrate, facing the second surface, the carrier substrate including second TVs traversing between first and second outer surfaces of the carrier substrate, the second TVs being: arranged in a second layout different from the first layout, and configured to transfer at least some of the heat between the first and second outer surfaces, and (c) a heat dissipation layer, formed between the die and the carrier surface, and configured to connect and transfer at least some of the heat between the first TVs and the second TVs.

20 Claims, 7 Drawing Sheets

(51) Int. Cl.

| | |
|---|---|
| ***H10W 72/20*** | (2026.01) |
| ***H10W 74/10*** | (2026.01) |
| ***H10W 90/00*** | (2026.01) |
| *H10W 72/00* | (2026.01) |
| *H10W 74/00* | (2026.01) |

(56) References Cited

U.S. PATENT DOCUMENTS

| | | | | |
|---|---|---|---|---|
| 2022/0262778 | A1* | 8/2022 | Yu | H10W 90/00 |
| 2023/0025094 | A1* | 1/2023 | Huang | H10W 20/42 |
| 2023/0361068 | A1* | 11/2023 | Sun | H10W 90/00 |

OTHER PUBLICATIONS

Intel Technology, "Foveros Direct: Advanced Packaging Technology to Continue Moore's Law", pp. 1-1, Dec. 11, 2021, downloaded from https://www.youtube.com/watch?v=fqumhx7CgzQ.

Lapedus, "Next-Gen 3D Chip/Packaging Race Begins," Semiconductor Engineering, SMG-Semiengineering Com., pp. 1-22, years 2013-2023, as downloaded from https://semiengineering.com/next-gen-3d-chip-packaging-race-begins/.

Ajinomoto Group, "Insulation film—Ajinomoto Build-up Film", pp. 1-3, May 18, 2022, as downloaded from https://web.archive.org/web/20220518195416/https://www.aft-website.com/en/products/insulating_film-abf/.

ShinEtsuMicroSi, "Thermal Interface Material X23-7772-4," Technical Data Sheet, pp. 1-3, revised Apr. 7, 2011, as downloaded from https://j6i3r2y3.stackpathcdn.com/wp-content/uploads/2015/06/DS-20X-23-7772-4.pdf.

Henkel Corporation, "Loctite Ablestik 965-1L," Technical Data Sheet, pp. 1-2, Oct. 2014, as downloaded from https://datasheets.tdx.henkel.com/LOCTITE-ABLESTIK-965-1L-en_US.pdf.

* cited by examiner

THREE-DIMENSIONAL DEVICE PACKAGE WITH CARRIER SUBSTRATE AND THERMAL VIAS

CROSS-REFERENCE TO RELATED APPLICATIONS

This application claims the benefit of U.S. Provisional Patent Application 63/344,665, filed May 23, 2022, whose disclosure is incorporated herein by reference.

FIELD OF THE DISCLOSURE

The present invention relates generally to electronic devices, and particularly to methods and systems for improving heat dissipation in a three-dimensional (3D) package of stacked integrated circuits (ICs) and a carrier substrate.

BACKGROUND

Various techniques are known in the art for stacking multiple ICs in electronic devices and dissipating heat therefrom. Some packaging techniques of such stacked ICs may employ carrier substrates to provide dimensional stability, but such carrier substrate may also negatively impact the dissipation of heat generated by active IC components in the package.

The description above is presented as a general overview of related art in this field and should not be construed as an admission that any of the information it contains constitutes prior art against the present patent application.

SUMMARY

An embodiment that is described herein provides an electronic device that includes (1) a die, including: (a) a first surface having electronic components formed thereon, (b) a second surface opposite the first surface, and (c) first thermal vias (TVs) traversing through the die between the first and second surfaces, the first TVs being: (i) arranged in a first layout, and (ii) configured to dissipate heat generated by operation of the electronic components, (2) a carrier substrate, which is facing the second surface of the die, the carrier substrate including second TVs traversing between first and second outer surfaces of the carrier substrate, the second TVs being: (i) arranged in a second layout different from the first layout, and (ii) configured to transfer at least some of the heat between the first and second outer surfaces, and (3) a heat dissipation layer, which is (i) formed between the die and the carrier surface, and (ii) configured to connect and transfer at least some of the heat between the first TVs and the second TVs.

In some embodiments, the first TVs are arranged in at least a first cluster and a second cluster that are disjoint from one another, and the heat dissipation layer includes first and second sections that are disjoint from one another: (i) the first section connecting between the first cluster and one or more of the second TVs, and (ii) the second section connecting between the second cluster and at least one of the second TVs. In other embodiments, the heat dissipation layer includes a contiguous sublayer connecting between: (i) the first and second sections, and (ii) the second TVs. In yet other embodiments, the first TVs are arranged in at least first and second clusters that are disjoint from one another, and the heat dissipation layer includes a contiguous layer connecting between: (i) the first and second clusters, and (ii) the second TVs.

In some embodiments, the die has a first thickness, and the carrier substrate has a second thickness, different from the first thickness. In other embodiments, the first and second layouts differ in one or both of: (i) first and second sizes of the first and second TVs, respectively, and (ii) first and second locations of the first and second TVs, respectively. In yet other embodiments, the electronic device includes an additional die including: (a) a third surface having additional electronic components formed thereon, the third surface being electrically connected to interconnection terminals, (b) a fourth surface, which is: (i) opposite the third surface, and (ii) facing the first surface of the die, and (c) through die vias (TDVs) traversing through the additional die between the third and fourth surfaces, the TDVs are: (i) arranged in a third layout, and (ii) configured to conduct electrical signals between (a) the electronic components of the die, and (b) the interconnection terminals.

In some embodiments, the electronic device includes a substrate configured to exchange at least the electrical signals between the electronic device and one or more external devices, the interconnection terminals are formed between the substrate and a stack including: (i) the additional die, (ii) the die mounted over the additional die, and (iii) the carrier substrate mounted over the die. In other embodiments, the electronic device includes a lid, which is: (a) mounted over the substrate, and (b) configured to: (i) encapsulate at least the stack, and (ii) dissipate heat from the stack. In yet other embodiments, the electronic device includes a thermal interface material (TIM) layer disposed between the lid and the carrier substrate.

There is additionally provided, in accordance with an embodiment of the present invention, a method for producing an electronic device, the method including: disposing on a substrate a die, including: (a) a first surface having electronic components formed thereon, (b) a second surface opposite the first surface, and (c) first thermal vias (TVs) traversing through the die between the first and second surfaces, the first TVs being arranged in a first layout for dissipating heat generated by operation of the electronic components. A carrier substrate is bonded to the second surface of the die, the carrier substrate includes second TVs traversing between first and second outer surfaces of the carrier substrate, the second TVs being arranged in a second layout different from the first layout, for transferring at least some of the heat between the first and second outer surfaces. A heat dissipation layer is fabricated, between the die and the carrier surface, for connecting and transferring at least some of the heat between the first TVs and the second TVs.

The present disclosure will be more fully understood from the following detailed description of the embodiments thereof, taken together with the drawings in which:

DETAILED DESCRIPTION OF EMBODIMENTS

Figure 1:
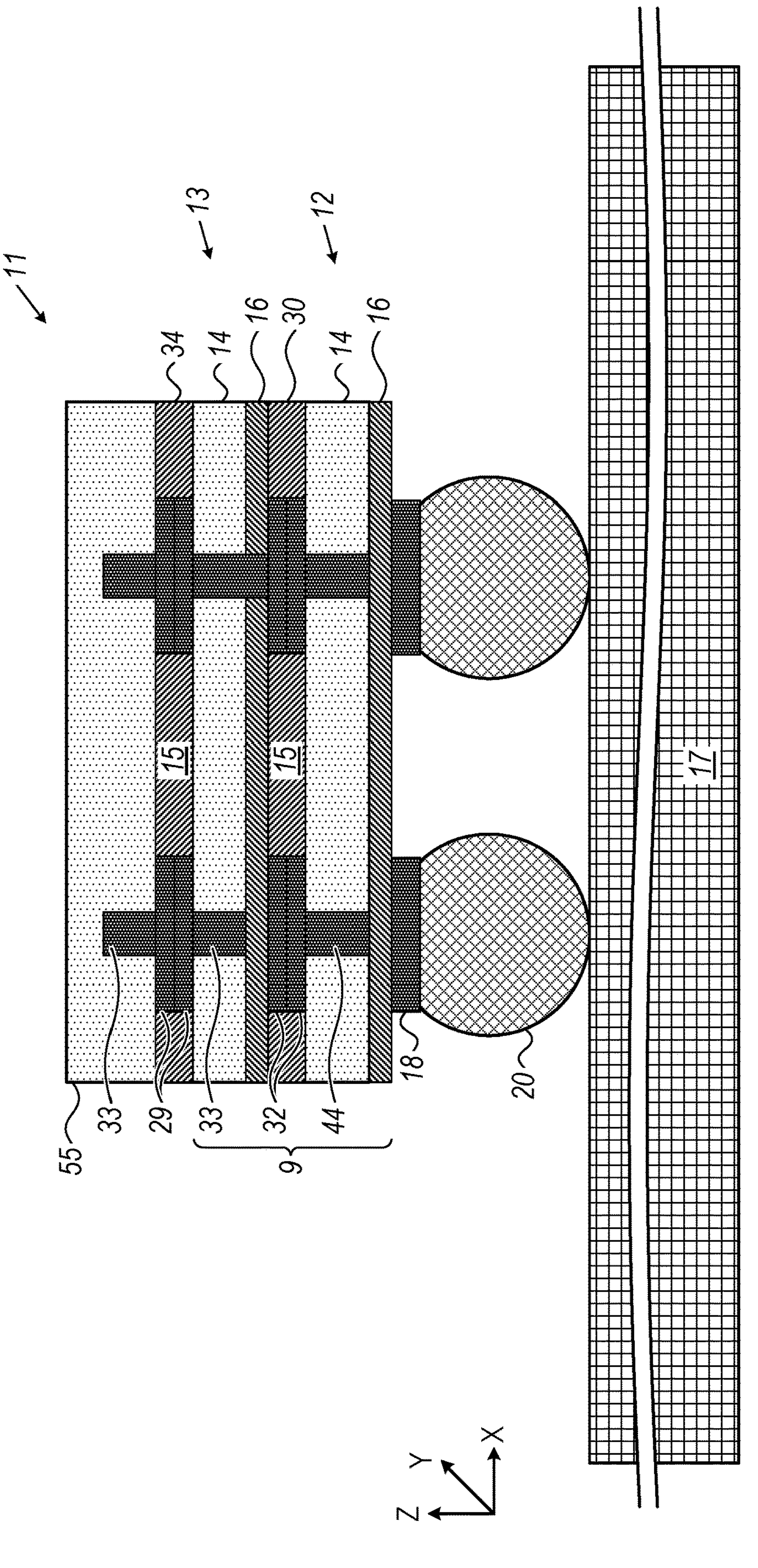
FIGS. 1-5 are schematic, sectional views of various configurations of electronic devices comprising stacked dies coupled to a carrier substrate, in accordance with embodiments that are described herein.

Electronic devices may comprise multiple dies stacked together over a substrate in a three-dimensional (3D) package. Each of the dies is typically formed on a semiconductor (e.g., silicon) substrate having front and back sides that are coplanar with a major plane of the die. The dies comprise electronic components and interconnections formed on the face (i.e., front side), which is opposite the backside of the semiconductor substrate. The electronic components and interconnections are configured to exchange electrical signals with the substrate of the 3D package, and in some cases, with one another.

The number and type of dies of such 3D packages depend on the application of the electronic device. While being operated, the electrical current flowing through the electronic components of each die generates heat.

Some dies of the electronic devices comprise integrated circuit (IC) dies used in high-power applications, such as signal switching and acceleration of deep learning models and processes. During operation in a steady state, these high-power IC dies consume an average electrical power greater than about 100 watts (W) with peak power consumption greater than about 110 W. These figures depend on the application, configuration, and workload environment of the electronic device.

The heat generated by the IC die typically is proportional to its power consumption. Therefore, the rate of heat dissipation away from the packaged IC die must increase approximately proportionally with the power consumption of the IC die.

Typically, the semiconductor substrate of such high-power IC die has low thermal conductivity, for example, the thermal conductivity of a silicon wafer is about 149 W/m·K at room temperature (298.2 K), whereas the thermal conductivity of a copper wire at the same temperature is about 398 W/m·K. Thus, it is possible to improve the rate of heat dissipation by reducing the thickness of each high-power IC die.

Some switching and deep learning applications require stacking the IC dies in a face to back (F2B) configuration, e.g., for improving the electrical performance (e.g., speed and quality) of signals transferred in the 3D stack. The reduced thickness of high-power IC dies requires coupling (e.g., bonding) between the stacked dies and a carrier substrate, which is configured to increase the stiffness of the 3D stack to prevent cracking or breaking of one or more of the stacked IC dies. However, such carrier substrate is typically fabricated from silicon or another suitable material having a coefficient of thermal expansion (CTE) and thermal conductivity matched to that of the semiconductor substrate of the IC dies. This is important to mitigate the possibility of stress and cracking as the temperature of the semiconductor substrate increases.

In order to dissipate the heat from the stacked dies, (i) an outer IC die of the stack is coupled to a first surface of the carrier substrate, and (ii) a heat sink is coupled (e.g., via thermal interface material) to a second surface of the carrier substrate, opposite the first surface. It is noted that this F2B configuration increases resistance to heat dissipation away from the 3D stack, because the heat must be transferred through (i) the backside of the outer IC die, substrate, both of which are and (ii) the carrier typically made from having silicon low thermal conductivity.

In other words, the F2B stacking of high-power IC dies on a carrier substrate may theoretically improve the electrical performance of the electronic device, but it may also result in overheating and failure of the device during operation.

Embodiments of the present disclosure that are described herein provide techniques for improving performance of an electronic device, by improving the heat dissipation rate from a face to back (F2B) stack of high-power IC dies coupled to a carrier substrate. In the context of the present disclosure and in the claims, the terms "die," "IC die," and grammatical variations thereof are used interchangeably.

In some embodiments, the electronic device comprises (i) a laminated substrate (or any other suitable substrate of the electronic device), whose properties are described in detail with reference to FIG. 1 below, (ii) a stack of dies stacked on the laminated substrate, each of the stacked dies comprising electronic components and interconnections, and (iii) a carrier substrate made from silicon and configured to improve the stiffness of the stack of dies.

In some embodiments, at least one of, and typically each of the dies in the stack has (a) electronic components formed on a first surface (also referred to herein as the face or front side) thereof, and (b) a second surface (also referred to herein as the backside) opposite the first surface. The stack comprises: (i) an outer die, which is coupled to the carrier substrate, and (ii) one or more inner dies, stacked between the outer die and the laminate substrate.

In some embodiments described herein, the inner dies and the outer die are stacked in a F2B configuration, so that the first surface of each die (having the electronic components thereon) is facing the laminated substrate, and the second surface is facing the carrier substrate. Each of the inner dies comprises one or more vias traversing the die, and therefore, are referred to herein as through die vias (TDVs) or through silicon vias (TSVs) when the substrate of the inner dies is made from silicon.

In some embodiments, each of the dies further comprises interconnection terminals and the TSVs of the inner dies are configured to conduct electrical signals between (a) the electronic components of at least an adjacent die of the stack, and (b) interconnection terminals of the die. In other words, when a first die is stacked over a second die, the one or more TSVs of the second die are configured to conduct electrical signals between (a) the electronic components of the first die, and (b) the interconnection terminals of the second die. Moreover, when the outer die is stacked on a given inner die, the one or more TSVs of the given inner die are configured to conduct electrical signals between (a) the electronic components of the outer die, and (b) the interconnection terminals of the given inner die. It is noted that conventionally the carrier substrate is employed to provide dimensional stability and does is absent any sort of electronic components and/or conductive pattern. As such, TSVs are not required in the outer die.

As described above for all the stacked dies, during operation, the electronic components of the outer die also generate heat. In some embodiments, both the outer die and the carrier substrate have thermal vias (TVs) that are (i) traversing therethrough, and (ii) configured to dissipate at least the heat generated by the electrical components of the outer die.

In the present example, one or more first TVs traverse the outer die between the front side and the backside thereof, the first TVs being: (i) arranged in a first layout, and (ii) configured to dissipate heat generated by operation of the electronic components of the outer die. Moreover, the carrier substrate is disposed between the outer die and a heat sink (also referred to herein as a heat spreader, for generalization) or a lid of the electronic device, such that first and second outer surface of the carrier substrate are facing the outer die and the heat sink, respectively.

In some embodiments, the carrier substrate comprises one or more second TVs traversing between the first and second outer surfaces thereof. The second TVs being: (i) arranged in a second layout different from the first layout, and (ii) configured to transfer (e.g., conduct) at least some of the heat (generated by the outer die) between the first outer surface and second outer surface, so as to dissipate the heat through the heat sink. It is noted that in the science of heat transfer, heat transferred via solid material (conduction), liquids and gases (convection), and electromagnetic waves (radiation). Thus, in the context of the present disclosure and in the claims, the terms "transfer" and "conduct" of the heat, as well as grammatical variations of these terms, are used interchangeably.

In some embodiments, the electronic device comprises one or more heat dissipation layers, which are: (i) formed between the outer die and the carrier substrate, and (ii) being configured to transfer (e.g., conduct) at least some of the heat (generated by the outer die) between the first TVs and the second TVs. Several configurations of the TVs and TSVs are presented and described in detail in FIGS. 1-5 below.

In alternative embodiments, the techniques described above may be applied to packaging of a given electronic device comprising a single die. For example, the given electronic device may comprise (i) the laminate substrate, (ii) the outer die, and (iii) the carrier substrate that are described above, but not the inner dies. In this configuration, the outer die is coupled between the laminate substrate and the carrier die. Moreover, the first and second TVs are formed in the outer die and the carrier substrate, respectively, and the heat dissipation layer(s) are being configured to conduct at least some of the heat (generated by the outer die) between the first TVs and the second TVs.

Additionally, or alternatively, the laminate substrate is mounted on an additional substrate, such as a printed circuit board (PCB), and the disclosed techniques may also be used for fabricating a conductive grounding path between the one or more dies and the PCB, as described in FIG. 6 below.

The description above is presented as a general overview of embodiments of the present disclosure, which are described in detail herein.

Figure 2:
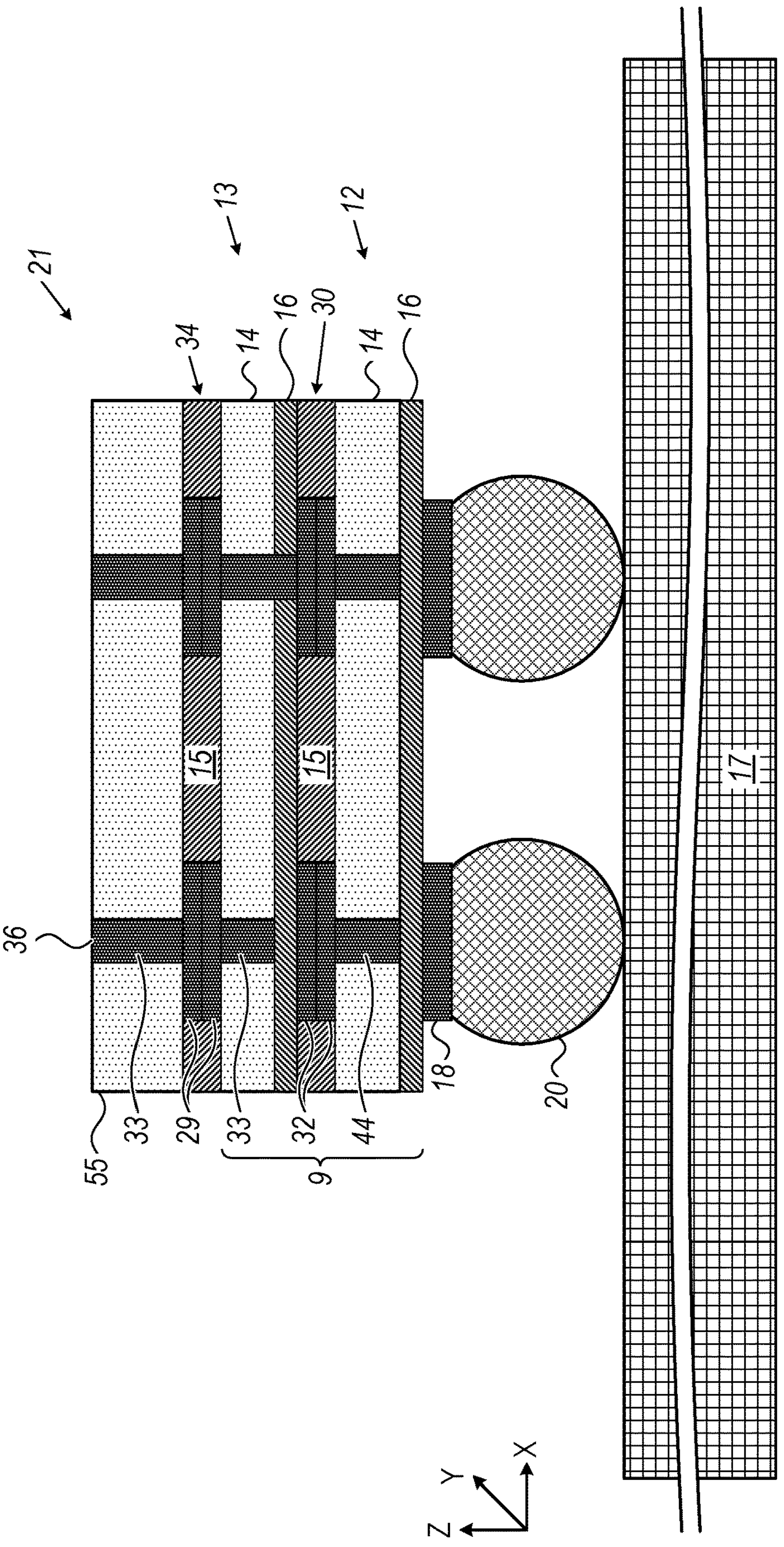

FIGS. 1 and 2 are schematic, sectional views of an electronic devices 11 and 21, respectively, in accordance with embodiments that are described herein.

Reference is now made to FIG. 1. In some embodiments, electronic device 11, also referred to herein as device 11 for brevity, comprises a substrate 17, and a stack 9 of dies 12 and 13, stacked on substrate 17 and described in detail below.

In some embodiments, substrate 17 comprises a suitable polymer or ceramic substrate and metal traces (not shown) patterned in the substrate. In the present example, substrate 17 comprises Ajinomoto Build-up Film® (ABF) laminate GL-102 produced by Ajinomoto Fine-Techno Co. Inc. (Kawasaki-shi, 210-0801, Japan), or any other suitable package substrate, and the metal traces comprise copper or any suitable conductive metal alloy, which are produced using any suitable processing techniques of circuit boards and integrated circuit (IC) substrates. In some embodiments, substrate 17, also referred to herein as a laminate substrate, has a thickness between about 0.4 mm and 3 mm along a Z-axis of an XYZ coordinate system.

In the context of the present disclosure and in the claims, the terms "about" or "approximately" for any numerical values or ranges indicate a suitable dimensional tolerance that allows the part or collection of components to function for its intended purpose as described herein.

In some embodiments, stack 9 comprises multiple dies, in the present example dies 12 and 13. Each of dies 12 and 13 comprises a semiconductor substrate 14 (e.g., silicon, germanium, gallium arsenide) having electronic components 16 and interconnections (not shown). Substrate 14 has first and second opposite surfaces, also referred to herein as front and back sides, respectively. In the present example, electronic components 16 and interconnections are implemented in electronic circuits on the front side (i.e., face) of each of dies 12 and 13, and the backside is facing the front side and typically does not have any sort of electronic components. Moreover, dies 12 and 13 are arranged in a face to back (F2B) configuration, such that the face of die 13 is facing the back of die 12.

In some embodiments, device 11 comprises (i) pads 18 coupled to electronic components 16 of die 12, and (ii) solder balls 20 (or other suitable type of balls) coupled between pads 18 and substrate 17. Pads 18 and solder balls 20 are configured to electrically couple between substrate 17 and electronic components 16 of at least die 12, as will be described herein. It is noted that, in an embodiment (i) the diameter of solder balls 20 is between about tens of microns and hundreds of microns, (ii) the thickness of pads 18 is between 0.1 μm and 20 μm, and (iii) the thickness of substrate 17 is several millimeters, substantially larger than that of balls 20 and pads 18.

In some embodiments, die 12 comprises one or more through-silicon vias (TSVs) 44 configured for conducting electrical signals therethrough, at least along a Z-axis of an XYZ coordinate system of device 11. TSVs 44 are made from copper or from any other suitable type of electrically conductive material. In an embodiment, at least one of TSVs 44 may be connected to ground, and other TSVs 44 may conduct power signals and/or data signals between dies 12 and 13, and/or between one of dies 12 and 13 and substrate 17. It is noted that in the F2B configuration, TSVs 44 are configured to exchange any of the above signals between: (i) electronic components 16 of die 12 and die 13, and (ii) substrate 17. Additionally, or alternatively, TSVS 44 are configured to exchange any of the above signals directly between dies 12 and 13.

In some embodiments, device 11 comprises a hybrid bond stack 30 formed between dies 12 and 13. Hybrid bond stack 30 comprises one or more dielectric layers 15, typically at least two oxide layer coupled to one another. In the present example, dielectric layers 15 comprises $SiO_2$, or $SiC_xN_y$, or $SiO_xN_y$, or any other suitable electrically dielectric materials, and have a thickness between about 1.2 μm and 1.5 μm.

In some embodiments, hybrid bond stack 30 is configured to electrically isolate between dies 12 and 13. Hybrid bond stack 30 comprises electrical traces 32 made from copper (or any other suitable conductive layer). In the present example, electrical traces 32 being configured to conduct the aforementioned signals between electronic components 16 of die 13 and TSV 44.

In some embodiments, device 11 and a device 21 (described in detail below) are used in high-power applications, such as signal switching and acceleration of deep learning models and processes. During a steady state of their operation, active components 16 of at least one of, and typically both dies 12 and 13 consume an average electrical power greater than about 100 watts (W) with peak power consumption greater than about 110 W.

The heat generated by active components 16 of dies 12 and 13 is typically proportional to their power consumption. Therefore, the rate of heat dissipation away from dies 12 and 13, must increase approximately proportionally with the power consumption of each of these dies.

In the present example, substrate 14 is made from silicon and has low thermal conductivity, e.g., about 149 W/m·K at room temperature (298.2° K), and at about operating temperature of 100° C. of devices, the thermal conductivity of silicon is about 117.5 W/m·K. Thus, it is possible to improve the rate of heat dissipation in dies 12 and 13 by reducing the thickness of substrate 14. For example, the thickness of substrate 14 may be reduced from about 780 μm to about 10 μm, or to any other suitable thickness. It is noted, however, that substrate 14 comprises a single crystal of silicon, which becomes mechanically brittle when reducing the thickness relative to the surface area of the die. In order to operate effectively in high-power applications, the surface area of dies 12 and 13 is typically large, e.g., about 2.5 cm by 2.5 cm, and therefore, substrate 14 of dies 12 and 13 becomes brittle at a thickness that is less than about 50 μm or even 100 μm.

In some embodiments, each of devices 11 and 21 comprise a carrier substrate 55 configured to improve the stiffness of dies 12 and 13, and of stack 9, and thereby, to prevent cracking and/or other sort of mechanical damage to any of dies 12 and 13. More specifically the backside of die 13 is coupled to carrier substrate 55, which is made from silicon in order to match the coefficient of thermal expansion (CTE), (e.g., between about $2.6\times10^{-6}$/° C. and $3.3\times10^{-6}$/° C.) of substrate 14. It is noted that unmatched CTE between substrate 14 and carrier substrate 55 may also cause cracking of at least die 13, and typically the entire stack 9, when the temperature of at least one of dies 12 and 13 increases while being operated as described above.

In some embodiments, devices 11 and 21 are both encapsulated using a lid (depicted in FIG. 6 below) and/or being coupled to a heat sink (not shown) being configured to dissipate the heat generated while dies 12 and 13 are being operated.

In the example of device 11, carrier substrate 55 has a thickness of about 780 μm, or any other suitable thickness which provides sufficient stiffness to device 11. However, when at least die 13 is being operated, the heat generated by electronic components 16 must be transferred to the lid and/or heat sink through (i) the backside of die 13, and (ii) carrier substrate 55, both made from silicon having the aforementioned low thermal conductivity. Thus, the F2B stacking of high-power dies 12 and 13 on carrier substrate 55 may result, in some cases, in overheating and failure of devices 11 and 21 while being operated.

In some embodiments, one or more thermal vias (TVS) 33 are formed in each of die 13 and carrier substrate 55. In the present example, TVs 33 comprise holes through the silicon of carrier substrate 55, which filled with copper whose thermal conductivity at room temperature is about 398 W/m·K or from any other suitable material having thermal conductivity larger than about 300 W/m·K.

In some embodiments, TVs 33 are configured to dissipate the heat (generated by electronic components 16) away from electronic components 16 of at least die 13. TVs 33 may have the same layout as TSVs 44 or a different layout. In the context of the present disclosure and in the claims, the term layout refers to one or both of: (i) the arrangement of the elements (e.g., TSVs and TVs) at respective locations in the XY plane of the respective substrates (in the XYZ coordinate system), and (ii) the size and shape of these elements, e.g., thickness along the Z-axis, diameter in the XY plane, and a pitch in the XY plane. In the context of the present disclosure and in the claims, the terms pitch or pitch size refer to the combination of the diameter of a single TV or TSV, and minimal distance between the most adjacent TVs or TSVs, respectively.

In some embodiment, TVs 33 and TSVs 44 of devices 11 and 21 have the same layout. In other embodiments, TVs 33 and TSVs 44 of one or both devices 11 and 21 have the same arrangement in the XY plane, but at least one of TSVs 44 and at least one of TVs 33 may have a different thickness along the Z-axis. In yet other embodiments, the TVs and the TSVs may have a different layout, as will be described in detail in FIGS. 3 and 4 below.

Moreover, in the example of devices 11 and 21, the TVs formed in both die 13 and carrier substrate 55 have the same layout, and therefore, are denoted using the same numeral 33. In other embodiments, the TVs traversing die 13 may have a given layout, different from the layout of the TVs traversing carrier substrate 55, as will be described in the examples of FIGS. 3 and 4 below.

Additionally, or alternatively, at least one of TVs 33 and a least one of TSVs 44 are made from different materials. Moreover, at least two TVs 33 may comprise different materials, for example, TVs 33 traversing die 13 and carrier substrate 55 may comprise first and second different alloys of copper, respectively.

In some embodiments, a multilayered hybrid bond stack 34 is formed between carrier substrate 55 and the backside of die 13. Hybrid bond stack 34 may have the same structure of hybrid bond stack 30 described above, or alternatively, minor changes (e.g., in thickness or material composition) relative to that of hybrid bond stack 30. Hybrid bond stack 34 comprises one or more dielectric layers 15, and thermal traces 29 made from copper (or from any other suitable conductive layer). Thermal traces 29, also referred to herein as a heat dissipation layer, and traces 29 for brevity, are being configured to conduct the aforementioned heat (generated by electronic components 16 of at least die 13) between TVs 33 formed in die 13 and in carrier substrate 55.

In some embodiments, thermal traces 29 and electrical traces 32 may have the same layout and may comprise the same one or more materials. In other embodiments, at least one of thermal traces 29 and at least one of electrical traces 32 may have a different layout and/or made from different materials. In yet other embodiments, at least two thermal traces 29 may have a different layout and/or may comprise different materials. It is noted that electronic components 16 of at least die 13 may generate different amounts of heat at different areas of device 13. For example, an area generating more heat is referred to herein as a hot spot in the respective die. Thus, a different layout and/or different material may be applied to adjust the level of heat transfer to heat generated at the respective areas of electronic components 13. It is noted, however, that using different materials in TVs traversing the same substrate typically requires two masking processes that increase the fabrication costs of at least one of electronic devices 11 and 21. The different arrangement in the XY plane, can be applied using a suitable design (also referred to as physical layout) of the respective masks in the lithography process, and is therefore more applicable because it does not increase the fabrication costs of devices 11 and/or 21.

In the example of device 11, TVs 33 do not fully traverse carrier substrate 55. In some embodiments, TVs 33 are formed before carrier substrate 55 is coupled to die 13, for instance by hybrid bond stack 34, so that TVs 33 do not have the same thickness of carrier substrate 55. With reference to FIG. 2, the thickness of carrier substrate 55 of device 21 is reduced from about 780 μm to that of TVs 33, so that a surface 36 of at least one TV 33 (and typically all TVs 33) is revealed so as to enable direct contact between TV 33 and the lid and/or heat sink of the package of device 21. For example, TVs 33 that traverse carrier substrate 55 may have a diameter of about 10 μm and thickness of about 100 μm (e.g., to maintain an aspect ratio of about 10:1 between the thickness and diameter, respectively, which may be a constraint of the fabrication process). Thus, the thickness of carrier substrate 55 may be reduced to about 100 μm in order to reveal surface 36 as described above.

In some embodiments, the thickness of carrier substrate 55 must be larger than about 100 μm (e.g., to improve the stiffness of device 21). In such embodiments, the nominal diameter of TVs 33 (formed in carrier substrate 55) may be increased (e.g., to about 15 μm or 20 μm, depending on the pitch constraints of the package design), so as to enable a greater thickness (e.g., about 150 μm or 200 μm) of TVs 33, while maintaining the fabrication constraint of about 10:1 (or any other constraint of aspect ratio.

It is noted that (i) the configuration of device 11 improves the heat dissipation compared to that of F2B 3D stacking that do not have TVs, and (ii) the configuration of device 21 improves the heat dissipation compared to that of device 11 by enabling direct contact (or contact through thermal interface material described in FIG. 6 below) between (a) surface 36 of TVs 33, and (b) the lid and/or heat sink. In some cases, an electrical disconnection is required between surface 36 and the lid and/or heat sink, e.g., in order to prevent electrical short(s) between the lid and/or heat sink and one or both dies 12 and 13. Thus, in other embodiments, a thin electrically insulating layer is formed between (a) surface 36 of TVs 33, and (b) the lid and/or heat sink, in order to enable the heat dissipation while achieving the required electrical disconnection described above. Alternatively, by disposing an electrically conductive thermal interface material directly over surface 36 of TVs 33, in an embodiment device 21 is grounded to the lid and to substrate 17, as will be described in detail in FIG. 6 below.

In some embodiments, pairs of TVs 33 of die 13 and carrier substrate 55 are aligned along the Z-axis in order to minimize the length of the heat dissipation path. Moreover, at least a portion of the heat generated by electronic components 16 of die 12 is conducted by at least one of TSVs 44, and therefore, TVs 33 and TSVs 44 are also aligned along the Z-axis for minimizing the length of the heat dissipation path. Similarly, traces 29 and 32 are aligned along the Z-axis. It is noted that when the size of traces 29 and 32 in XY plane is larger than that of TVs 33 and TSVs 44, respectively, at least one pair of TV 33 and TSV 44 and/or at least one pair of TVs 33 need not be aligned along the Z-axis, because the heat dissipates in a sufficiently short path. It is noted that all TVs 33 must have physical contact with traces 29 in order to dissipate the heat generated by electronic components 16 of die 13. In alternative embodiments, at least one pair of (i) traces 29 and 32, and/or (ii) TVs 33, and/or (iii) TVs 33 and TSVs 44, may not be aligned along the Z-axis. In such embodiments, the heat still dissipates therethrough, but the rate of heat dissipation is typically lower because the heat dissipation path is longer compared to that of the aligned configuration of pairs of the traces, TVs, and TSVs, which is described above.

These particular configurations of electronic devices 11 and 21 are shown by way of example, in order to illustrate certain problems, such as heat dissipation, which are addressed by embodiments of the present invention and to demonstrate the application of these embodiments in enhancing the heat dissipation, and thereby, the electrical performance of such electronic devices. Embodiments of the present invention, however, are by no means limited to these specific sorts of example electronic devices, and the principles described herein may similarly be applied to 3D stacking of dies (in F2B or other suitable arrangements) in other types of electronic devices that are known in the art.

In alternative embodiments, in at least one of devices 11 and 21, dies 12 and 13 are both disposed side-by-side over substrate 17, rather than being stacked, for example, in the configuration of stack 9. In such embodiments, dies 12 and 13 are both electrically connected to substrate 17 via pads 18 and solder balls 20, as described above. In these embodiments, both hybrid bond stack 30 and TSVs 44 are eliminated from the configuration of devices 11 and 21, and electronic components 16 of die 13 are also connected to pads 18 using a suitable configuration (as shown in the example of die 12).

In other embodiments, at least one of devices 11 and 21 only comprises die 13, which is disposed over substrate 17. In such embodiments, die 13 is electrically connected to substrate 17 via pads 18 and solder balls 20, as described above for die 12. Moreover, both hybrid bond stack 30 and TSVs 44 are eliminated from the configuration of devices 11 and 21, and electronic components 16 of die 13 are directly connected to pads 18 using a suitable configuration, as shown in the example of die 12 of electronic devices 11 and 21. In other words, the disclosed techniques may be applied to packaging of: (i) 3D dies stacked in F2B configuration as well is in face-to-face (F2F) and back-to-back (B2B) configurations, (ii) dies arranged in a side-by-side configuration, and (iii) a single die.

Figure 3:
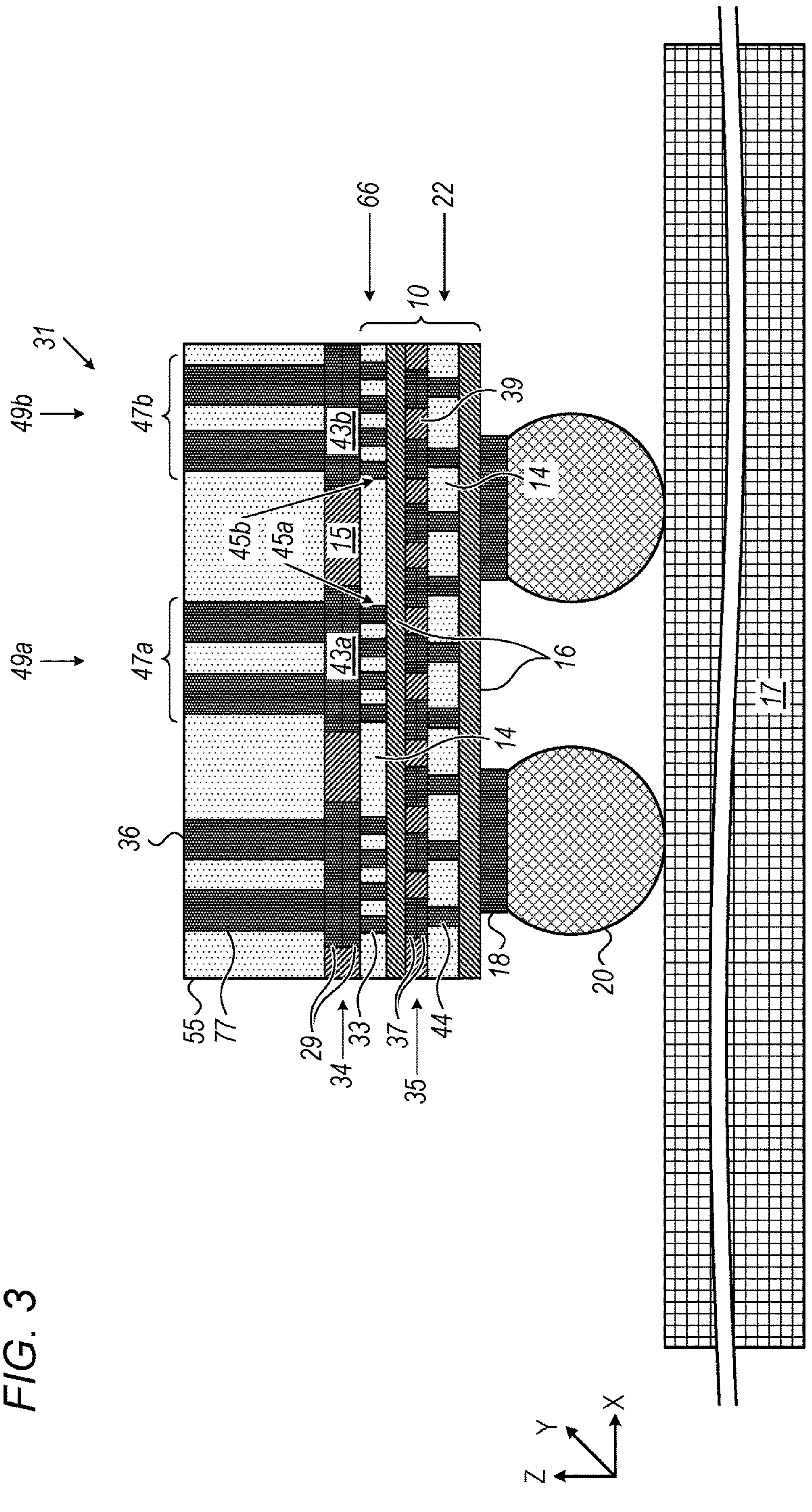
Figure 4:
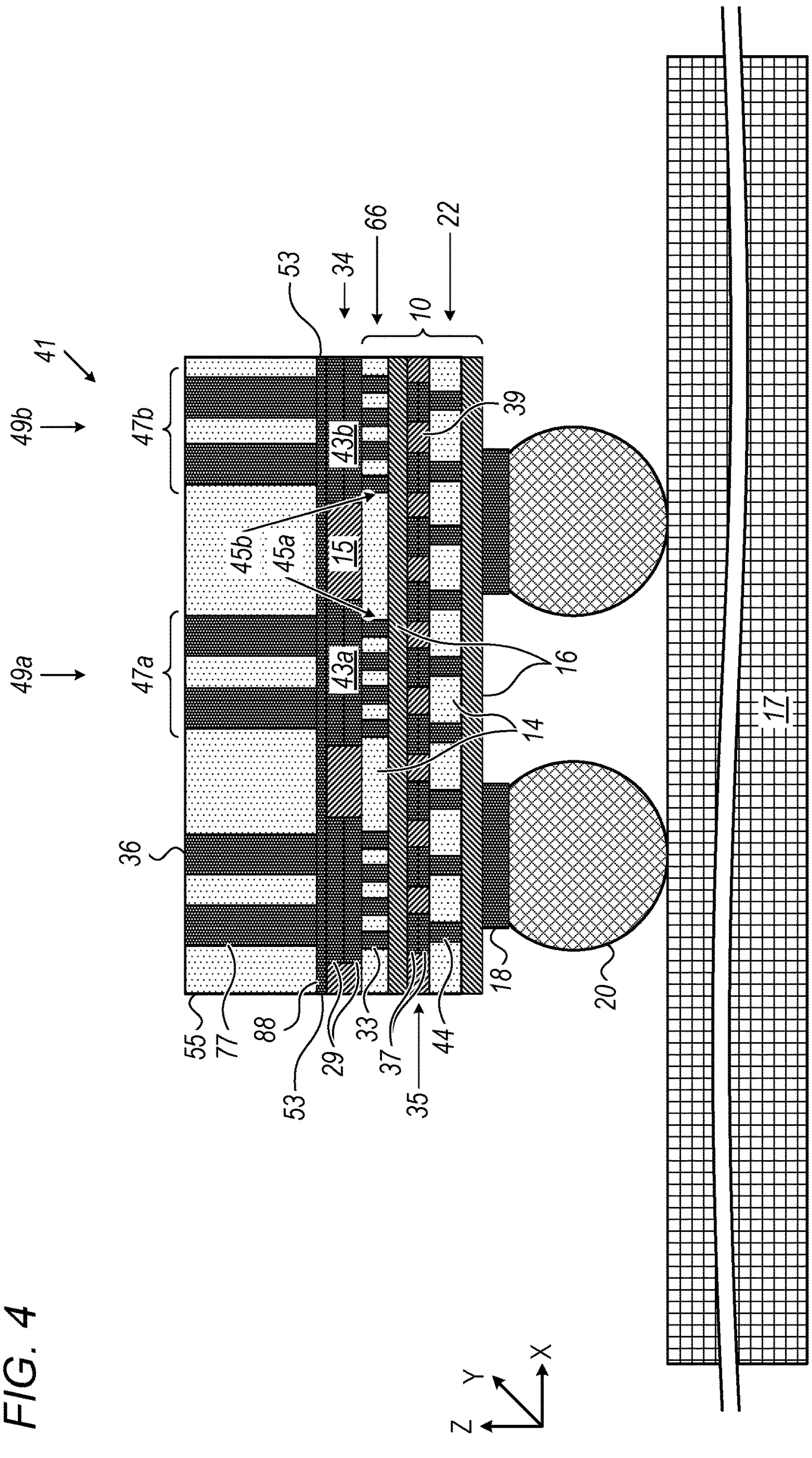

FIGS. 3 and 4 are schematic, sectional views of electronic devices 31 and 41, in accordance with embodiments that are described herein. Electronic devices 31 and 41 are also referred to herein as devices 31 and 41, for brevity.

In some embodiments, both devices 31 and 41 comprise a stack 10 of dies 22 and 66 arranged in a F2B configuration, such that (i) electronic components 16 formed on the front side of die 22, are facing substrate 17, (ii) electronic components 16 formed on the front side of die 66, are facing the backside of die 22, and (iii) the backside of die 66 is facing carrier substrate 55.

In some embodiments, one or more TSVs 44 traverse between the front side and the backside of die 22, one or more TVs 33 traverse between the front side and the backside of die 66, as described in FIGS. 1 and 2 above. Moreover, one or more TVs 77 traverse along the Z-axis of carrier substrate 55.

In some embodiments, both devices 31 and 41 comprise multilayered hybrid bond stack 34 formed between carrier substrate 55 and the backside of die 66. Hybrid bond stack 34 comprises one or more dielectric layers 15, and thermal traces 29 made from copper. Moreover, both devices 31 and 41 comprise a multilayered hybrid bond stack 35 formed between the backside of die 22 and the front side of die 66. Hybrid bond stack 35 comprises one or more dielectric layers 39, and thermal traces 37 made from copper. In the example of devices 31 and 41, bond stack 34 is similar to that of devices 11 and 21 of FIGS. 1 and 2 above, respectively. In other embodiments, the hybrid bond stacks between carrier substrate 55 and the backside of the upper-most die may differ from one another in the configurations of two or more of devices 11, 21, 31 and 41.

In some embodiments, TSVs 44, TVs 33 and TVs 77 have first, second, and third layouts, respectively, that may differ from one another. Moreover, hybrid bond stack 35 may differ from hybrid bond stack 30 of FIGS. 1 and 2 above. The difference between the layouts of hybrid bond stacks y result from the differences between the aforementioned first, second, and third layouts of TSVs 44, TVs 33 and TVs 77, respectively, or from any other suitable reason, such as constraints related to the design of dies 22 and 66, and the stacking and packaging thereof.

In the present example, the thickness of substrates 14 of both dies 22 and 66 is about 10 μm or less, the diameter of TSVs 44 is about 2 μm or less, and the pitch of TSVs 44 is about 10 μm or less. Note that in other embodiments, one or more of TSVs 44 may have different diameter and/or different pitch than the figures described above. The dimensions (in X-, Y-, and Z-axes) and the arrangement in XY plane, depend on the layout of electronic components 16 of die 22.

In some embodiments, the layout of TVs 33 may be similar to, but typically is different from that of TSVs 44 in at least one parameter. For example, the diameter of TVs 33 may be similar to that of TSVs 44, but as shown in FIGS. 3 and 4, the arrangement of TVs 33 in the XY plane, as well as the pitch size of TVs 33, are different than that of TSVs 44. In another example configuration, the pitch of TVs 33 and TSVs 44 is similar, but the arrangement in XY may differ, and one or more pairs of TVs 33 and TSVs 44 are not aligned along the Z-axis. In yet another example, the layouts of TVs 33 and TSVs 44 may be similar to one another. Additionally, for alternatively, in addition to TSVs 44 die 22 may comprise TVs that traverse between the backside and the front side of substrate 14 of die 22. Note that typically, the TVs do not consume real estate of electronic components 16 located at the active area of die 22.

In some embodiments, TVs 77 typically have a different layout compared to that of TVs 33. For example, TVs have: (i) a typical diameter of about 10 μm or larger (e.g., about 5 times larger than that of TVs 33), (ii) a thickness between about 200 μm and 780 μm (matched to the thickness of carrier substrate 55 in order to reveal surface 36 of TVs 77, and substantially larger than the 10 μm thickness of TVs 33), and (iii) a pitch of about 100 μm (e.g., about 5 times larger than that of TVs 33) or any other suitable pitch. Moreover, the arrangement of TVs 77 differs from that of TVs 33, but clusters of TVs 33 and 77 are coupled to common traces 29 in order to optimize the path heat dissipation from electronic components 16 of die 66, as described herein.

In some embodiments, (i) TVs 33 are arranged (e.g., patterned) in multiple clusters 45, such as clusters 45*a* and 45*b* that are disjoint (i.e., separated) from one another by substrate 14 of die 66, (ii) TVs 77 are arranged (e.g., patterned) in multiple clusters 47, such as clusters 47*a* and 47*b* that are disjoint (i.e., separated) from one another by carrier substrate 55, and (iii) traces 29 of hybrid bond stack 34 are laid out (e.g., patterned) in sections 43, such as sections 43*a* and 43*b* that may be disjoint (i.e., separated) from one another. It is noted that each cluster among clusters 45 and 47 may comprise one or more TVS 33 and 77, respectively.

Reference is now made to FIG. 3. In some embodiments, section 43*a* connects between clusters 45*a* and 47*a*, and section 43*b* connects between clusters 45*b* and 47*b*. It is noted that: (i) a first portion of the heat generated by electronic components 16 of at least die 66 dissipates in a first channel 49*a* through clusters 45*a* and 47*a*, and section 43*a*, (ii) a second portion of the heat generated by electronic components 16 of at least die 66 is dissipates in a second channel 49*b* through clusters 45*b* and 47*b*, and section 43*b*, and (iii) the first and second portions of the heat dissipate separately through first and second channels 49*a* and 49*b*, respectively, and are not mixed with one another.

Reference is now made to FIG. 4. In some embodiments, device 41 comprises an additional heat dissipation layer, referred to herein as a layer 88, which is contiguous in the XY plane, and is disposed over hybrid bond stack 34. In other words, layer 88 is disposed between hybrid bond stack 34 and substrate 55 (and TVs 77). In the example of FIG. 4, layer 88 overlays the entire surface of hybrid bond stack 34, but in other embodiments, layer 88 may be disposed over sufficiently (one or more) portions of hybrid bond stack 34. In both embodiments, layer 88 is configured to connect between the sections and/or clusters of channels 49*a* and 49*b*. In the example of FIG. 4, layer 88 connects (i) between multiple sections 43 (e.g., between sections 43*a* and 43*b*), and also, (ii) between multiple clusters 47 (e.g., between clusters 47*a* and 47*b*). In such embodiments, layer 88 improves the uniformity of heat dissipation across the XY plane of device 41 compared to that of device 31 of FIG. 3 above. Moreover, layer 88 extends to edges 53 of device 41, and thereby, at least a portion of the heat may also dissipate through edges 53 without being conducted through TVs 77. Thus, layer 88 is configured to increase the rate of heat dissipation in device 41, compared to that of at least device 31 described with reference to FIG. 3 above.

In other embodiments, instead of producing traces 29 and layer 88 separately, the heat dissipation layer of device 41 may comprise a single contiguous layer. In such embodiments, the heat dissipation layer has a first thickness at the footprint of channels 49 (e.g., the combined thickness of traces 29 and layer 88), and second, smaller thickness, at the sections between the footprint of channels 49 (e.g., the thickness of layer 88). For example, the one or more dielectric layers 15 are formed in the pattern shown in FIGS. 3 and 4, and subsequently, the heat dissipation layer is disposed as a single layer having alternating thickness, e.g., using a single copper deposition operation.

These particular configurations of electronic devices 31 and 41 are shown by way of example, in order to illustrate certain problems, such as heat dissipation, particularly in a package for stacked IC dies and/or in a package of a single IC die, which are addressed by embodiments of the present invention and to demonstrate the application of these embodiments in enhancing the heat dissipation, and thereby, the electrical performance of such electronic devices. Embodiments of the present invention, however, are by no means limited to these specific sort of example heat dissipation layers and electronic devices, and the principles described herein may be similarly applied to 3D stacking of dies (in F2B or other suitable arrangements) in other sorts of heat dissipation layers, sections of layers, traces, TVs and TSVs, and electronic devices that are known in the art.

Figure 5:
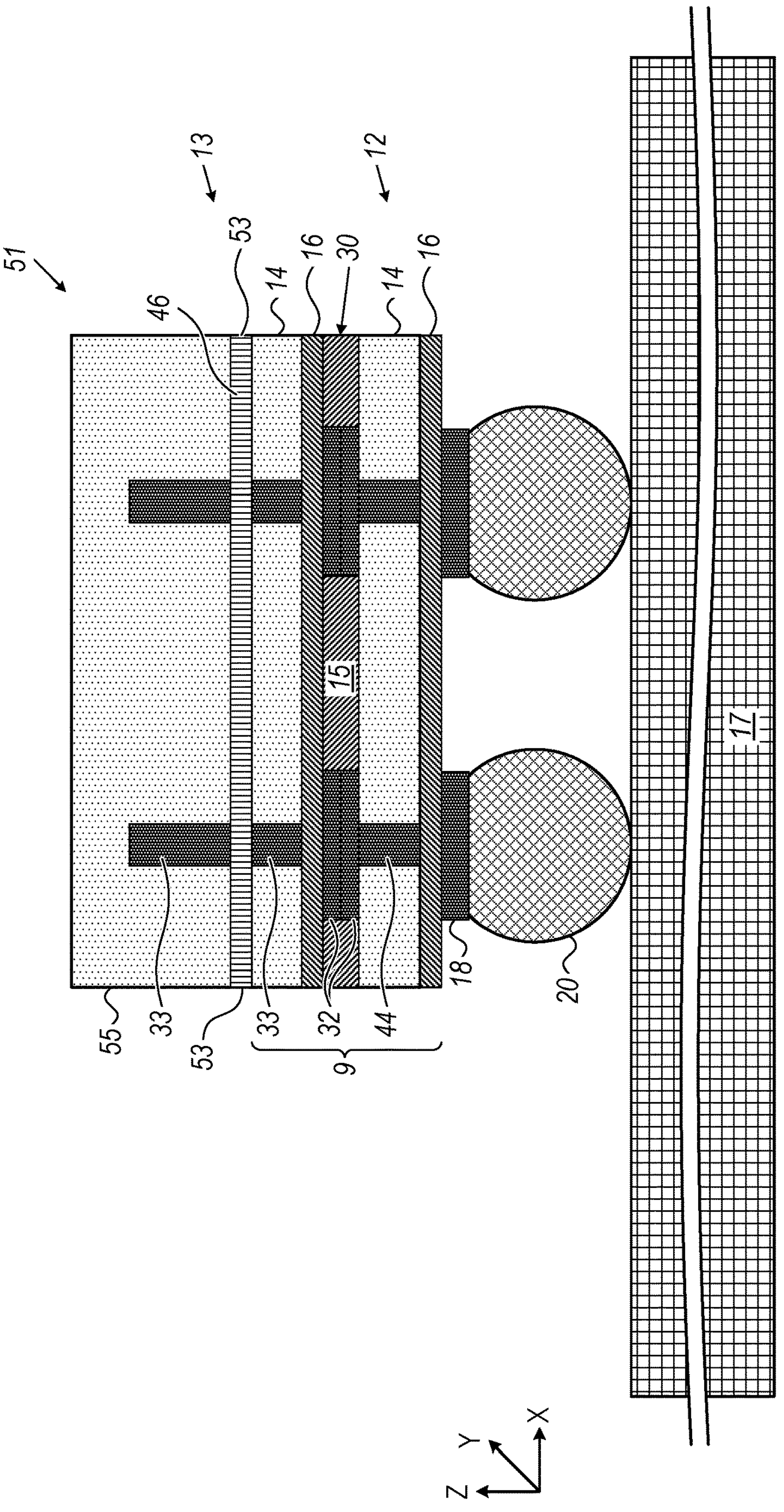

FIG. 5 is a schematic, sectional view of an electronic device 51, in accordance with an embodiment that is described herein. Electronic device 51 is also referred to herein as device 51, for brevity.

In some embodiments, device 51 comprises a thermally conductive bonding layer 46, which is disposed between (i) substrate 14 of die 13, and (ii) carrier substrate 55. In some embodiments, bonding layer 46 comprises TIM—x23-7772-4, Gel, having a thickness between about 20 μm to 150 μm. this product is supplied by Shin-Etsu, (Marunouchi Eiraku Building., 4-1, Marunouchi 1-chome, Chiyoda-ku, Tokyo 100-0005, Japan). Bonding layer 46 is configured to dissipate at least a portion of the heat (generated by electronic components 16 of at least die 13) across at least a portion of the XY plane of device 51. Moreover, bonding layer 46 may comprises the aforementioned X23-7772-4 gel having thermal conductivity of about 3.8 W/m·K, or alternatively, indium solder alloy metal TIM having thermal conductivity of about 86 W/m·K.

In some embodiments, bonding layer 46 is contiguous and extends across the entire surface of device 51 to edges 53 of device 51. In such embodiments, at least a portion of the aforementioned heat may also dissipate through edges 53 without being conducted through TVs 33.

In some embodiments, the present configuration of device 51 is similar to that of device 11 of FIG. 1 above, but the contiguous bonding layer 46 replaces hybrid bond stack 34, and all other components are similar to that of device 11 (subject to necessary adjustments). It is noted that in case the thermal conductivity of bonding layer 46 is approximately similar to that of copper, the contiguous geometry and extension to edges 53 may improve the heat dissipation rate of device 51 compared to that of device 11 of FIG. 1 above.

In other embodiments, subject to necessary adjustments, bonding layer 46 may also be implemented instead of or in addition to hybrid bond stack 34 in at least one of devices 21, 31, and 41 described above.

Figure 6:
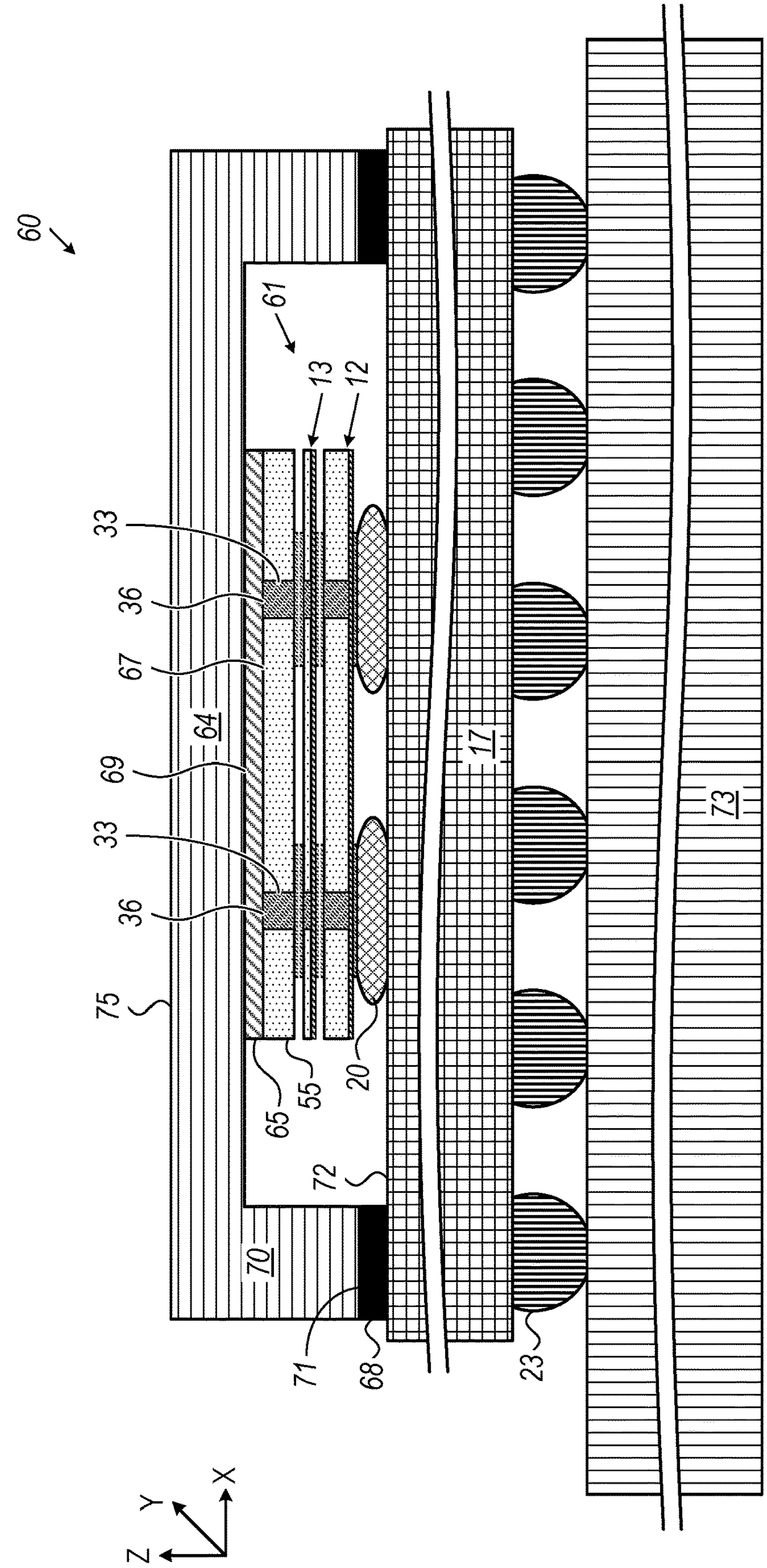
FIG. 6 is a schematic, sectional view of the electronic device of FIG. 2 in a package, in accordance with an embodiment that is described herein.

FIG. 6 is a schematic, sectional view of an electronic device 61 enclosed in a package 60, in accordance with an embodiment that is described herein. Electronic device 61 is also referred to herein as device 61, for brevity.

In the present example, device 61 has a configuration similar to that of device 21 of FIG. 2 above. The thickness of die 12 may be larger than that of die 13 (as shown in FIG. 6), or the thickness of dies 12 and 13 may be equal, depending on the configuration and the applications of the dies and of device 61. In other implementations, device 61 may have any other suitable configuration, such as but not limited to: (i) the F2B configurations of devices 11, 31, 41 and 51 described above, (ii) the side-by-side and/or the single die configurations described in FIGS. 1 and 2 above, and (iii) any other suitable configuration of any suitable dies intended to serve in the aforementioned high-power applications.

In some embodiments, package 60 of device 61 comprises a lid 64, which typically surrounds device 61, and is configured to encapsulate device 61. In the present example, lid 64 is typically made from a suitable metal (e.g., nickel-plated copper) having a thickness (e.g., along the Z-axis) between about 0.3 mm and 3 mm. The metal-based lid 64 has high thermal conductivity, for example, the thermal conductivity of nickel is about 97 W/mK and the thermal conductivity of copper is about 398 W/mK.

In some embodiments, package 60 further comprises a thermal interface material (TIM) layer 65 disposed between (i) an upper surface 67 of carrier substrate 55, and surface 36 of TVs 33, and (ii) a lower surface 69 of lid 64.

In some embodiments, TIM layer 65 comprises the aforementioned conductive gel product X23-7772-4, and having a thickness between about 20 μm and 150 μm. TIM layer 65 is configured bond between (i) surfaces 67 and 36, and (ii) surface 69, and to transfer at least a portion of the heat generated by die 13 to lid 64, to dissipate heat away from electronic device 61. In the present example, TIM layer 65 has a thermal conductivity of about 3.8 W/mK.

In some embodiments, lid 64 has sections 70 having a surface 71 mounted over ground pads (not shown) formed over a surface 72 of substrate 17. Moreover, package 60 comprises an adhesive layer, referred to herein as a layer 68, which is disposed between surface 71 and the ground pads formed over surface 72. Layer 68 is configured to couple between lid and substrate 17.

In some embodiments, layer 68 comprises an epoxy-based adhesive, such as a LOCTITE ABLESTIK 965-1L product, supplied by Hankel Corporation (14000 Jamboree Road, Irvine, CA 92606, USA), having a thickness between about 50 μm and 200 μm. In the present example, the electrical conductivity of layer 68 is defined by volume resistivity smaller than about 0.0005 ohms-cm.

In some embodiments, package 60 comprises solder balls 23 of a ball grid array (BGA) that are formed between substrate 17 and a printed circuit board (PCB) 73. Solder balls 23 are configured to serve as terminals and to conduct electrical signals between substrates 17 and PCB 73.

In other embodiments, instead of balls 23, package 60 may comprise pads of a land grid array (LGA), and PCB 73, or any suitable one or more additional substrates, may have suitable pins aligned with the pads for exchanging signals therebetween. Alternatively, instead of balls 23, package 60 may comprise pins of a pin grid (PGA), and PCB 73, or any suitable one or more additional substrates, may have one or more respective sockets with holes configured to fit over the pins of package 60 for exchanging signals between device 61 and PCB 73 or the one or more additional substrates.

In some embodiments, substrate 17 may comprise a ground picket fence (not shown), which is embedded in conductive layers of substrate 17. Moreover, PCB 73 may comprise dedicated ground planes (not shown) embedded in conductive layers thereof. In such embodiments, some of balls 23 are selected among the array of balls 23 to serve as dedicated ground balls. It is noted that in this configuration, device 61 and package 60 have a ground shield. In an embodiment, a path of the ground shield extends between TVs 33 and the dedicated ground planes of PCB 73. In the present configuration, the ground signals pass through (i) TIM layer 65, (ii) lid 64 (and section 70 thereof), (iii) layer 68, (iv) substrate 17 and the picket fence thereof, and (v) the aforementioned dedicated ground balls 23. It is noted that all the components of the path (including at least TVs 33 and conductive traces of PCB 73) are configured to conduct the ground signals between device 61 and the dedicated ground planes of PCB 73.

In alternative embodiments, e.g., in case no ground shield is required, at least some components of the path described above may be eliminated from the configuration of package 60. Moreover, in such embodiments, layer 68 may have lower electrical conductivity compared to that described above.

In some embodiments, a heat sink (not shown) may be coupled to a surface 75 of lid 64. The heat sink is configured to dissipate heat from lid 64, and thereby, to increase the rate of heat dissipation away from device 61 and package 60. It is noted that the coupling of the heat sink is optional, and in other embodiments, the heat sink may be eliminated or be replaced by any other suitable element for increasing the rate of heat dissipation away from device 61 and package 60.

This particular configuration of package 60 and electronic device 61 is shown by way of example, in order to illustrate certain problems that are addressed by embodiments of the present invention and to demonstrate the application of these embodiments in enhancing the heat dissipation and ground shielding, and thereby, the electrical performance of such electronic devices packaged by such packages. Embodiments of the present invention, however, are by no means limited to these specific sort of example package and electronic device, and the principles described herein may similarly be applied to 3D stacking of dies (in F2B or other suitable arrangements) and packaging of such electronic devices that are known in the art.

Figure 7:
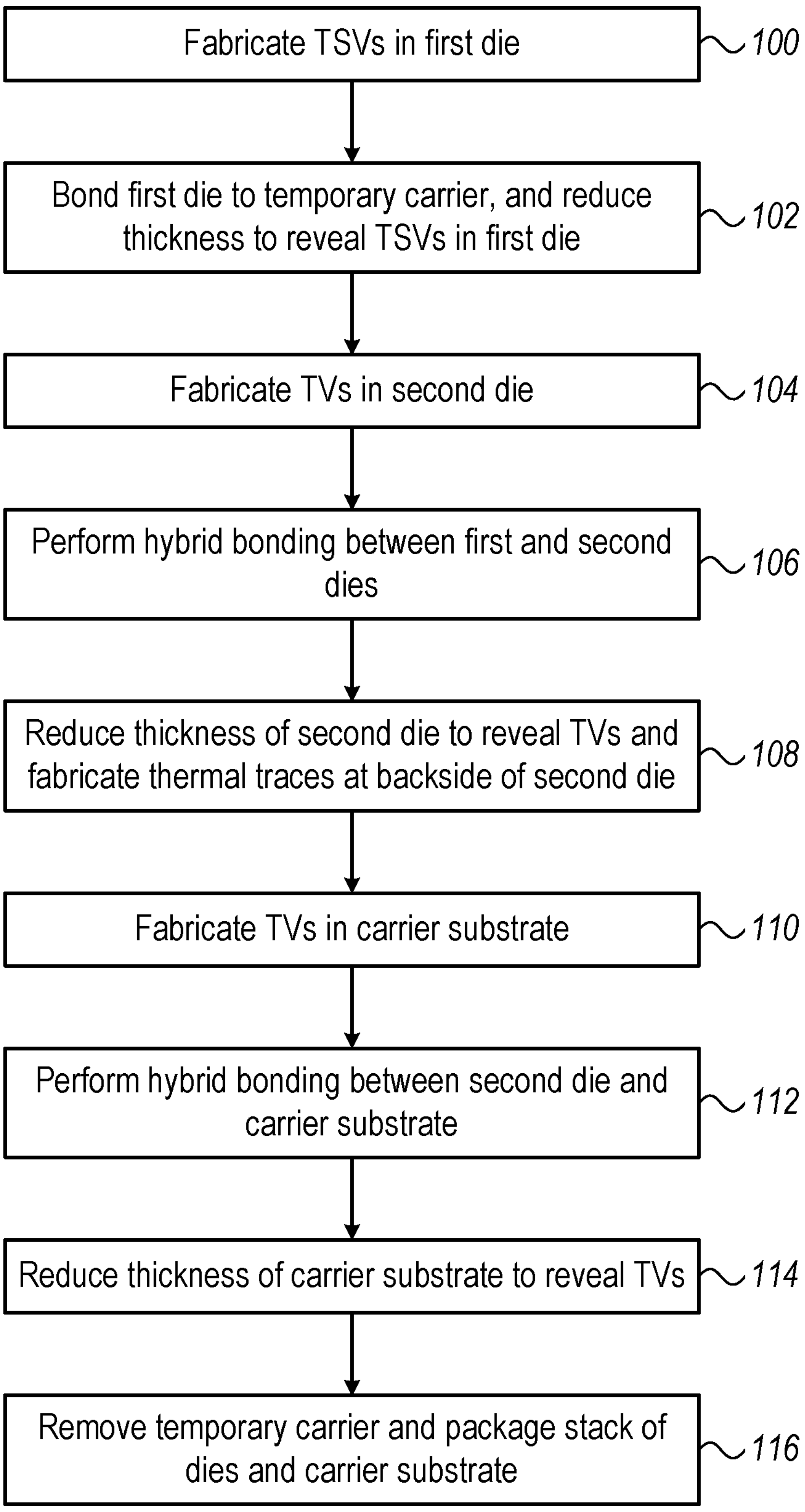
FIG. 7 is a flow chart that schematically illustrates a method for producing the electronic device of FIG. 3 and packaging thereof, in accordance with an embodiment that is described herein.

FIG. 7 is a flow chart that schematically illustrates a method for fabricating electronic device 31, in accordance with an embodiment that is described herein.

The method begins at a TSV fabrication operation 100 with fabricating TSVs 44 by (i) etching or laser drilling openings in a first silicon substrate 14 comprising at least die 22, and (ii) filling the openings with copper using any suitable sputtering and/or electroplating process followed by cleaning the outer surface of at least die 22 from copper residues.

At a TSV revealing operation 102, a temporary carrier substrate is bonded to the first silicon substrate 14 of die 22, the thickness of substrate 14 is reduced to approximately 10 μm, as described in FIGS. 1 and 2 above, and substrate 14 is diced in order to separate die 22 as an individual die.

At a first TV fabrication operation 104, TVs 33 are fabricated in die 66 by (i) etching or laser drilling openings in a second silicon substrate 14 comprising at least die 66, and (ii) filling the openings with copper using any suitable metal deposition technique, such as sputtering and/or electroplating, followed by cleaning the outer surface of at least die 66 from metal residues. In some embodiments, after fabricating TVs 33, the second silicon substrate 14 is diced and die 66 is separated from other sections of substrate 14 that are not within the footprint of die 66.

At a hybrid bonding operation 106, first multilayered hybrid bond stack 35 is formed between the backside of die 22 and the front side of die 66 for coupling between die 22 and die 66, as described in detail in FIGS. 3 and 4 above. In some embodiments, hybrid bond stack 35 typically comprises two bonded dielectric layers 39, and thermal traces 37 made from copper (or any other suitable metal or metal alloy), as described in FIGS. 3 and 4 above.

At a first TV revealing operation 108, the thickness of die 66 is reduced to reveal TVs 33 out of substrate 14 of die 66, and subsequently, at least one layer of thermal traces 29 is fabricated at the backside of die 66.

At a second TV fabrication operation 110, TVs 77 are fabricated in carrier substrate 55 by (i) etching or laser drilling openings in carrier substrate 55, and (ii) filling the openings with copper using any suitable sputtering and/or electroplating process followed by cleaning residues of copper (and in some cases residues of other substances) from the outer surface of carrier substrate 55, which is intended to face the backside of die 66.

In some embodiments, TVs 33 that are fabricated in operation 104 have a first layout, and TVs 77 that are fabricated in operation 110 have a second layout, different from the first layout of TVs 33, as shown and described in detail in FIGS. 3 and 4 above.

At a second hybrid bonding operation 112, multilayered hybrid bond stack 34 is formed between the backside of die 66 and the surface of carrier substrate 55 that had been cleaned in operation 110 above. In some embodiments, hybrid bond stack 34 is formed for coupling between the backside of die 66 and the aforementioned surface of carrier substrate 55, as described in detail in FIGS. 3 and 4 above. In some embodiments, hybrid bond stack 34 typically comprises two bonded dielectric layers 15, and thermal traces 29 made from copper, as described in FIGS. 1-4 above. Moreover, contiguous layer 88 may be optionally formed over traces 29, so as to improve the rate of heat dissipation, as shown and described in detail in FIG. 4 above.

In alternative embodiments, thermally conductive bonding layer 46 may be disposed (e.g., instead of hybrid bonded layer 34) between the outer die of the F2B stack, and the carrier substrate. This alternative configuration is presented and described in FIG. 5 above, in which thermally conductive bonding layer 46 is disposed between the backside of die 13, and carrier substrate 55.

At a second TV revealing operation 114, the thickness of carrier substrate 55 is reduced to reveal surface 36 of TVs 77, as described in detail and shown in FIGS. 2-4 above.

In alternative embodiments, operation 114 may be eliminated from the method, such that surface 36 of the TVs of device 31 are not revealed, but are buried within the bulk of the carrier substrate. This configuration is shown, for example, in FIGS. 1 and 5 above.

At a packaging operation 116 that concludes the method, (i) the temporary carrier is removed from die 22, which is mounted on substrate 17, via pads 18 and balls 20, (ii) TIM layer 65 is disposed over surfaces 36 and 67, (iii) electrically conductive adhesive layer 68 is disposed over surface 72, (iv) lid 64 is mounted on and being coupled to electronic device 61 and substrate 17 and (v) balls 23 are formed between PCB 73 and substrate 17. The packaging operation 116 is described in more detail in FIG. 6 above.

In some embodiments, a heat sink (not shown) may be coupled to surface 75 of lid 64, to increase the rate of heat dissipation away from device 61 and package 60, as described in FIG. 6 above.

The operations of the method of FIG. 7 are simplified for the sake of conceptual clarity and are provided by way of example. Embodiments of the present disclosure, however, are by no means limited to this specific sort of fabrication technique and optional process sequences, and the principles described herein may similarly be applied to other sorts of methods used for fabricating an electronic device comprising a F2B stack of dies and thermal vias or other suitable types of heat dissipation techniques.

It is noted that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An electronic device, comprising:

a die, comprising:

a first surface having electronic components formed thereon;

a second surface opposite the first surface; and first thermal vias (TVs) traversing through the die between the first and second surfaces, the first TVs being: (i) arranged in a first layout, and (ii) configured to dissipate heat generated by operation of the electronic components;

a carrier substrate, which is facing the second surface of the die and being configured to improve stiffness of the die, the carrier substrate having a first coefficient of thermal expansion (CTE) matching a second CTE of the die, the carrier substrate comprising second TVS traversing between first and second outer surfaces of the carrier substrate, the second TVs being: (i) arranged in a second layout different from the first layout, and (ii) configured to transfer at least some of the heat between the first and second outer surfaces, wherein a surface of at least one of the second TVs is revealed at the second outer surface of the carrier substrate; and a heat dissipation layer, which is (i) formed between the die and the carrier substrate, and (ii) configured to connect and transfer at least some of the heat between the first TVs and the second TVs.

2. The electronic device according to claim 1, wherein the first TVs are arranged in at least a first cluster and a second cluster that are disjoint from one another and wherein the heat dissipation layer comprises first and second sections that are disjoint from one another: (i) the first section connecting between the first cluster and one or more of the second TVs, and (ii) the second section connecting between the second cluster and at least one of the second TVs.

3. The electronic device according to claim 2, wherein the heat dissipation layer comprises a contiguous sublayer connecting between: (i) the first and second sections, and (ii) the second TVs.

4. The electronic device according to claim 1, wherein the first TVs are arranged in at least first and second clusters that are disjoint from one another, and the heat dissipation layer comprises a contiguous layer connecting between: (i) the first and second clusters, and (ii) the second TVs.

5. The electronic device according to claim 1, wherein the die has a first thickness, and the carrier substrate has a second thickness, different from the first thickness.

6. The electronic device according to claim 1, wherein the first and second layouts differ in one or both of: (i) first and second sizes of the first and second TVs, respectively, and (ii) first and second locations of the first and second TVs, respectively.

7. The electronic device according to claim 1, further comprising an additional die comprising:

a third surface having additional electronic components formed thereon, the third surface being electrically connected to interconnection terminals;

a fourth surface, which is: (i) opposite the third surface, and (ii) facing the first surface of the die; and through die vias (TDVs) traversing through the additional die between the third and fourth surfaces, the TDVs are: (i) arranged in a third layout, and (ii) configured to conduct electrical signals between (a) the electronic components of the die, and (b) the interconnection terminals.

8. The electronic device according to claim 7, further comprising a substrate configured to exchange at least the electrical signals between the electronic device and one or more external devices, wherein the interconnection terminals are formed between the substrate and a stack comprising: (i) the additional die, (ii) the die mounted over the additional die, and (iii) the carrier substrate mounted over the die.

9. The electronic device according to claim 8, comprising a lid, which is: (a) mounted over the substrate, and (b) configured to: (i) encapsulate at least the stack, and (ii) dissipate heat from the stack.

10. The electronic device according to claim 9, comprising a thermal interface material (TIM) layer disposed between the lid and the carrier substrate.

11. A method for producing an electronic device, the method comprising:

disposing on a substrate a die, comprising:

a first surface having electronic components formed thereon;

a second surface opposite the first surface; and first thermal vias (TVs) traversing through the die between the first and second surfaces, the first TVs being arranged in a first layout for dissipating heat generated by operation of the electronic components;

bonding, to the second surface of the die, a carrier substrate to improve stiffness of the die, the carrier substrate having a first coefficient of thermal expansion (CTE) matching a second CTE of the die, a surface of at least one of the second TVs being revealed at the second outer surface of the carrier substrate by reducing a thickness of the carrier substrate, the carrier substrate comprising second TVs traversing between first and second outer surfaces of the carrier substrate, the second TVs being arranged in a second layout different from the first layout, for transferring at least some of the heat between the first and second outer surfaces; and fabricating, between the die and the carrier substrate, a heat dissipation layer, for connecting and transferring at least some of the heat between the first TVs and the second TVs.

12. The method according to claim 11, wherein the first TVs are arranged in at least a first cluster and a second cluster that are disjoint from one another, and wherein fabricating the heat dissipation layer comprises fabricating first and second sections that are disjoint from one another: (i) the first section connecting between the first cluster and one or more of the second TVs, and (ii) the second section connecting between the second cluster and at least one of the second TVs.

13. The method according to claim 12, wherein fabricating the heat dissipation layer comprises fabricating a contiguous sublayer connecting between: (i) the first and second sections, and (ii) the second TVs.

14. The method according to claim 11, wherein the first TVs are arranged in at least first and second clusters that are disjoint from one another, and fabricating the heat dissipation layer comprises fabricating a contiguous layer connecting between: (i) the first and second clusters, and (ii) the second TVs.

15. The method according to claim 11, wherein the die has a first thickness, and the carrier substrate has a second thickness, different from the first thickness.

16. The method according to claim 11, wherein the first and second layouts differ in one or both of: (i) first and second sizes of the first and second TVs, respectively, and (ii) first and second locations of the first and second TVs, respectively.

17. The method according to claim 11, further comprising disposing, between the substrate and the die, an additional die comprising:

a third surface having additional electronic components formed thereon, the third surface being electrically connected to interconnection terminals;

a fourth surface, which is: (i) opposite the third surface, and (ii) facing the first surface of the die; and through die vias (TDVs) traversing through the additional die between the third and fourth surfaces, the TDVs are: (i) arranged in a third layout, and (ii) used for conducting electrical signals between (a) the electronic components of the die, and (b) the interconnection terminals.

18. The method according to claim 17, wherein the substrate is for exchanging at least the electrical signals between the electronic device and one or more external devices, further comprising, forming the interconnection terminals between the substrate and a stack comprising: (i) the additional die, (ii) the die mounted over the additional die, and (iii) the carrier substrate mounted over the die.

19. The method according to claim 18, comprising mounting over the substrate a lid for: (i) encapsulating at least the stack, and (ii) dissipating heat from the stack.

20. The method according to claim 19, comprising disposing a thermal interface material (TIM) layer between the lid and the carrier substrate.

* * * * *